(12) United States Patent
Nakano et al.

(10) Patent No.: US 10,236,353 B2
(45) Date of Patent: Mar. 19, 2019

(54) SEMICONDUCTOR DEVICE, POWER SUPPLY CIRCUIT, AND COMPUTER

(71) Applicant: Kabushiki Kaisha Toshiba, Minato-ku (JP)

(72) Inventors: Shintaro Nakano, Kawasaki (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 101 days.

(21) Appl. No.: 15/436,222

(22) Filed: Feb. 17, 2017

(65) Prior Publication Data

US 2017/0365671 A1 Dec. 21, 2017

(30) Foreign Application Priority Data

Jun. 20, 2016 (JP) ................... 2016-121786

(51) Int. Cl.
| | |
|---|---|
| *H01L 29/40* | (2006.01) |
| *H01L 29/20* | (2006.01) |
| *G06F 1/26* | (2006.01) |
| *H01L 29/205* | (2006.01) |
| *H01L 29/778* | (2006.01) |

(Continued)

(52) U.S. Cl.
CPC .............. *H01L 29/408* (2013.01); *G06F 1/26* (2013.01); *H01L 29/2003* (2013.01); *H01L 29/205* (2013.01); *H01L 29/401* (2013.01); *H01L 29/513* (2013.01); *H01L 29/66462* (2013.01); *H01L 29/7786* (2013.01);

(Continued)

(58) Field of Classification Search
None
See application file for complete search history.

(56) References Cited

U.S. PATENT DOCUMENTS 9,082,749 B2    7/2015  Taniguchi et al.
9,711,362 B2 *  7/2017  Shimizu ............... H01L 29/408
(Continued)

FOREIGN PATENT DOCUMENTS

| JP | 4883207 | 2/2012 |
| JP | 2014-116401 | 6/2014 |
| JP | 2014-241350 | 12/2014 |

*Primary Examiner* — Angel Roman
(74) *Attorney, Agent, or Firm* — Oblon, McClelland, Maier & Neustadt, L.L.P.

(57) ABSTRACT

A semiconductor device of an embodiment includes a first nitride semiconductor layer, a second nitride semiconductor layer located on the first nitride semiconductor layer and having a larger bandgap than the first nitride semiconductor layer, a first electrode on the second nitride semiconductor layer, a second electrode on the second nitride semiconductor layer, a gate electrode located between the first electrode and the second electrode, and a first insulating layer located at least between the gate electrode and the second electrode on the second nitride semiconductor layer, the first insulating layer being an oxide of at least one first element selected from the group consisting of Hf, Zr, and Ti, and containing $5 \times 10^{19}$ cm$^{-3}$ or more of at least one second element selected from the group consisting of F, H, D, V, Nb, and Ta, and $5 \times 10^{19}$ cm$^{-3}$ or more of at least one third element selected from the group consisting of N, P, As, Sb, Bi, Be, Mg, Ca, Sr, Ba, Sc, Y, and lanthanoids.

18 Claims, 12 Drawing Sheets

(51) Int. Cl.
 *H01L 29/66* (2006.01)
 *H01L 29/51* (2006.01)
 H01L 29/423 (2006.01)
 H01L 29/10 (2006.01)

(52) U.S. Cl.
 CPC ...... *H01L 29/7787* (2013.01); *H01L 29/1066* (2013.01); *H01L 29/4236* (2013.01)

(56) References Cited

U.S. PATENT DOCUMENTS

| | | |
|---|---|---|
| 2010/0193669 A1 | 8/2010 | Yamaguchi et al. |
| 2013/0200389 A1* | 8/2013 | Lee ................. H01L 29/205 257/76 |
| 2013/0256686 A1* | 10/2013 | Kanamura .......... H01L 29/205 257/76 |
| 2014/0042440 A1* | 2/2014 | Sun ................. H01L 31/02167 257/43 |
| 2014/0264451 A1* | 9/2014 | Ozaki ................. H01L 29/513 257/194 |
| 2017/0301799 A1* | 10/2017 | Boles ................. H01L 29/0649 |

* cited by examiner

SEMICONDUCTOR DEVICE, POWER SUPPLY CIRCUIT, AND COMPUTER

CROSS-REFERENCE TO RELATED APPLICATION

This application is based upon and claims the benefit of priority from Japanese Patent Application No. 2016-121786, filed on Jun. 20, 2016, the entire contents of which are incorporated herein by reference.

FIELD

Embodiments described herein relate generally to a semiconductor device, a power supply circuit, and a computer.

BACKGROUND

A semiconductor element such as a switching element or a diode is used in a circuit such as a switching power supply or an inverter. These semiconductor elements are required to have a high breakdown voltage and a low on-resistance. A relation between the breakdown voltage and the on-resistance is a trade-off relation depending on an element material.

Due to the progress of the technological development so far, a semiconductor element having a low on-resistance near a limit of silicon as a main element material has been realized. In order to further improve the breakdown voltage or further reduce the on-resistance, it is necessary to change the element material.

A GaN-based semiconductor such as gallium nitride (GaN) or aluminum gallium nitride (AlGaN) has a larger bandgap than silicon. By using a GaN-based semiconductor as a switching element material, the trade-off relationship depending on materials can be improved, and dramatically high breakdown voltage and low on-resistance can be achieved.

However, for example, when a high drain voltage is applied to a switching element using a GaN-based semiconductor, a problem called "current collapse" to increase on-resistance occurs. In order to improve reliability of a switching element, it is necessary to suppress the current collapse.

DETAILED DESCRIPTION

Here, the same reference sign is given to the same or similar components, and repeated description thereof may be omitted.

Here, the "GaN-based semiconductor" is a general term for a semiconductor including gallium nitride (GaN), aluminum nitride (AlN), indium nitride (InN), and an intermediate composition of GaN, AlN, and InN.

Here, "undoped" means that an impurity concentration is $1 \times 10^{15}$ cm$^{-3}$ or less.

Here, an upper direction in the drawings is described by "upper", and a lower direction in the drawings is described by "lower", in order to indicate positional relations between components or the like. Here, concepts of "upper" and "lower" do not necessarily indicate a relation to the gravity direction.

First Embodiment

A semiconductor device of the present embodiment includes a first nitride semiconductor layer, a second nitride semiconductor layer located on the first nitride semiconductor layer and having a larger bandgap than the first nitride semiconductor layer, a first electrode on the second nitride semiconductor layer, a second electrode on the second nitride semiconductor layer, a gate electrode located between the first electrode and the second electrode, and a first insulating layer located at least between the gate electrode and the second electrode on the second nitride semiconductor layer.

The first insulating layer is an oxide of at least one first element selected from the group consisting of hafnium (Hf), zirconium (Zr), and titanium (Ti), and contains $5 \times 10^{19}$ cm$^{-3}$ or more of at least one second element selected from the group consisting of fluorine (F), hydrogen (H), deuterium (D), vanadium (V), niobium (Nb), and tantalum (Ta), and $5 \times 10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), and lanthanoids (La, Ce, Pr, Nd, Pm, Sm, Eu, Gd, Tb, Dy, Ho, Er, Tm, Yb, and Lu).

Alternatively, the first insulating layer is an oxide of at least one first element selected from the group consisting of aluminum (Al), lanthanum (La), yttrium (Y), and scandium (Sc), and contains $5 \times 10^{19}$ cm$^{-3}$ or more of at least one second element selected from the group consisting of fluorine (F), hydrogen (H), deuterium (D), vanadium (V), niobium (Nb), and tantalum (Ta), and $5 \times 10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), and barium (Ba).

The semiconductor device of the present embodiment has the above structure, and the first insulating layer thereby holds a negative fixed charge. Therefore, trap of an electron in the first insulating layer is suppressed. Therefore, a semiconductor device having current collapse suppressed can be realized.

Figure 1:
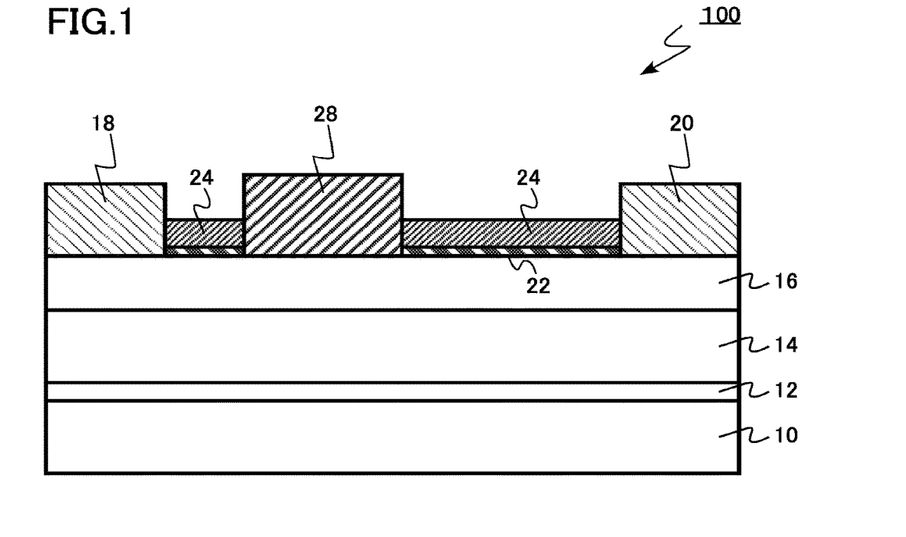
FIG. 1 is a schematic cross-sectional view of a semiconductor device of a first embodiment.

FIG. 1 is a schematic cross-sectional view of the semiconductor device of the present embodiment. The semiconductor device of the present embodiment is a high electron mobility transistor (HEMT) 100 using a GaN-based semiconductor.

As illustrated in FIG. 1, the HEMT (semiconductor device) 100 includes a substrate 10, a buffer layer 12, a channel layer (first nitride semiconductor layer) 14, a barrier layer (second nitride semiconductor layer) 16, a source electrode (first electrode) 18, a drain electrode (second electrode) 20, an interface film (second insulating layer) 22, a protection film (passivation film: first insulating layer) 24, and a gate electrode 28.

The substrate 10 is formed, for example, of silicon (Si). In addition to silicon, it is possible to use sapphire ($Al_2O_3$) or silicon carbide (SiC), for example.

The buffer layer 12 is provided on the substrate 10. The buffer layer 12 relaxes lattice mismatch between the substrate 10 and the channel layer 14. The buffer layer 12 is formed, for example, of a multilayer structure of aluminum gallium nitride ($Al_WGa_{1-W}N$ (0<W<1)). The channel layer 14 is provided on the buffer layer 12. The channel layer 14 is also referred to as an electron transit layer.

The channel layer 14 is formed, for example, of undoped $Al_XGa_{1-X}N$ (0≤X<1). More specifically, the channel layer 14 is formed, for example, of undoped gallium nitride (GaN). The channel layer 14 has a thickness, for example, of 0.1 μm or more and 10 μm or less.

The barrier layer 16 is provided on the channel layer 14. The barrier layer 16 is also referred to as an electron supply layer. The barrier layer 16 has a larger bandgap than the channel layer 14. The barrier layer 16 is formed, for example, of aluminum gallium nitride.

The barrier layer 16 is formed, for example, of undoped $Al_YGa_{1-Y}N$ (0≤Y<1, X<Y). The barrier layer 16 is formed, for example, of aluminum gallium nitride. More specifically, the barrier layer 16 is formed, for example, of undoped $Al_{0.25}Ga_{0.75}N$. The barrier layer 16 has a thickness, for example, of 10 nm or more and 100 nm or less.

A hetero-junction interface is formed between the channel layer 14 and the barrier layer 16. Two-dimensional electron gas (2DEG) is formed in the hetero-junction interface of the HEMT 100 to become a carrier.

The source electrode 18 and the drain electrode 20 are formed on the barrier layer 16. The source electrode 18 and the drain electrode 20 are, for example, metal electrodes. For example, each of the source electrode 18 and the drain electrode 20 has a structure in which titanium (Ti) and aluminum (Al) are stacked.

An ohmic contact is preferably formed between the source electrode 18 and the barrier layer 16 and between the drain electrode 20 and the barrier layer 16. A distance between the source electrode 18 and the drain electrode 20 is, for example, 5 μm or more and 30 μm or less.

The gate electrode 28 is provided on the barrier layer 16 between the source electrode 18 and the drain electrode 20. The gate electrode 28 is provided so as to be in contact with the barrier layer 16. Junction between the gate electrode 28 and the barrier layer 16 is Schottky junction.

The gate electrode 28 is a metal electrode, for example. The gate electrode 28 is formed, for example, of titanium nitride (TiN).

The interface film 22 is provided on a part of a surface of the barrier layer 16. The interface film 22 is formed, for example, of silicon nitride. The interface film 22 has a thickness, for example, of 1 nm or more and 10 nm or less.

The interface film 22 suppresses oxidation of the barrier layer 16 or detachment of an atom from the barrier layer 16. A surface coating layer of a nitride semiconductor having a different composition from the barrier layer 16 can be provided between the barrier layer 16 and the interface film 22. The surface coating layer is formed, for example, of gallium nitride.

A protection film 24 is provided on the interface film 22. The protection film 24 is provided between the gate electrode 28 and the drain electrode 20, and between the gate electrode 28 and the source electrode 18.

The protection film 24 is in contact with the gate electrode 28 and the drain electrode 20. In other words, the protection film 24 is formed over an entire area between the gate electrode 28 and the drain electrode 20.

The protection film 24 has a thickness, for example, of 5 nm or more and 100 nm or less. The thickness of the protection film 24 is preferably 20 nm or less from a viewpoint of making processing of the protection film 24 easy.

The protection film 24 is an oxide of at least one first element selected from the group consisting of hafnium (Hf), zirconium (Zr), and titanium (Ti). The protection film 24 contains $5 \times 10^{19}$ $cm^{-3}$ or more of at least one second element selected from the group consisting of fluorine (F), hydrogen (H), deuterium (D), vanadium (V), niobium (Nb), and tantalum (Ta). In addition, the protection film 24 contains $5 \times 10^{19}$ $cm^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), and lanthanoids (La, Ce, Pr, Nd, Pm, Sm, Eu, Gd, Tb, Dy, Ho, Er, Tm, Yb, and Lu).

In this case, examples of the oxide include hafnium oxide, zirconium oxide, hafnium aluminum oxide, zirconium aluminum oxide, hafnium silicate, and zirconium silicate.

Alternatively, the protection film 24 is an oxide of at least one first element selected from the group consisting of aluminum (Al), lanthanum (La), yttrium (Y), and scandium (Sc). The protection film 24 contains $5 \times 10^{19}$ $cm^{-3}$ or more of at least one second element selected from the group consisting of fluorine (F), hydrogen (H), deuterium (D), vanadium (V), niobium (Nb), and tantalum (Ta). In addition, the protection film 24 contains $5 \times 10^{19}$ $cm^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), and barium (Ba).

In this case, examples of the oxide include aluminum oxide, hafnium aluminum oxide, and zirconium aluminum oxide.

For example, an element contained in the protection film 24 and the concentration of the element can be measured by secondary ion mass spectroscopy (SIMS).

Next, an example of a method for manufacturing the semiconductor device of the present embodiment will be described. FIGS. 2 to 5 are schematic cross-sectional views of the semiconductor device of the present embodiment during manufacturing.

Hereinafter, description is given by exemplifying a case where the protection film 24 is an oxide of at least one first element selected from the group consisting of hafnium (Hf), zirconium (Zr), and titanium (Ti), and contains $5 \times 10^{19}$ $cm^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), and lanthanoids (La, Ce, Pr, Nd, Pm, Sm, Eu, Gd, Tb, Dy, Ho, Er, Tm, Yb, and Lu).

Hereinafter, description is given by exemplifying a case where the oxide is hafnium oxide, that is, the first element is hafnium (Hf), the second element is fluorine (F), and the third element is nitrogen (N).

First, the substrate 10, for example, a silicon substrate is prepared. Subsequently, for example, the buffer layer 12 is grown on the silicon substrate by epitaxial growth. For example, the buffer layer 12 is grown by a metal organic chemical vapor deposition (MOCVD) method.

Subsequently, undoped GaN to be the channel layer 14 and undoped $Al_{0.25}Ga_{0.75}N$ to be the barrier layer 16 are formed on the buffer layer 12 through epitaxial growth. For example, the channel layer 14 and the barrier layer 16 are grown by the MOCVD method.

Subsequently, a silicon nitride film to be the interface film 22 is formed on the barrier layer 16. The silicon nitride film is formed by a chemical vapor deposition (CVD) method, for example.

Figure 2:
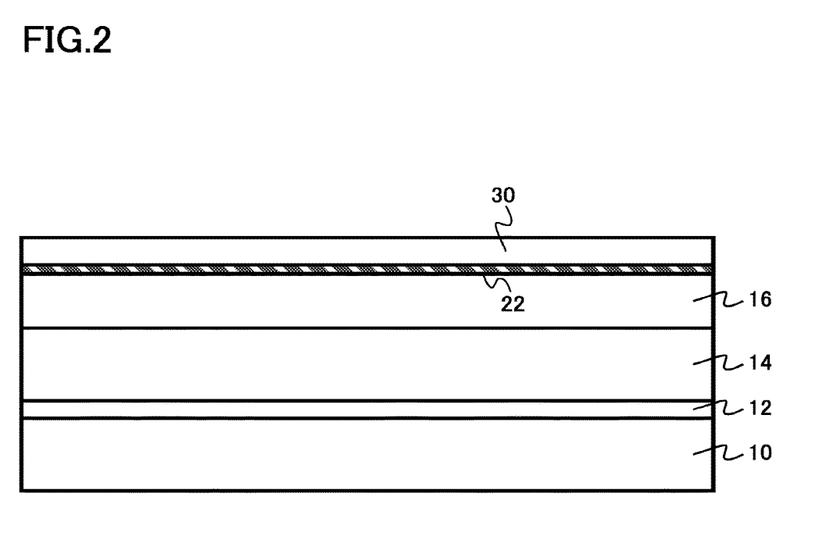
FIG. 2 is a schematic cross-sectional view of the semiconductor device of the first embodiment during manufacturing.

Subsequently, a hafnium oxide film 30 is formed on the interface film 22. The hafnium oxide film 30 is formed by a CVD method, for example (FIG. 2).

Figure 3:
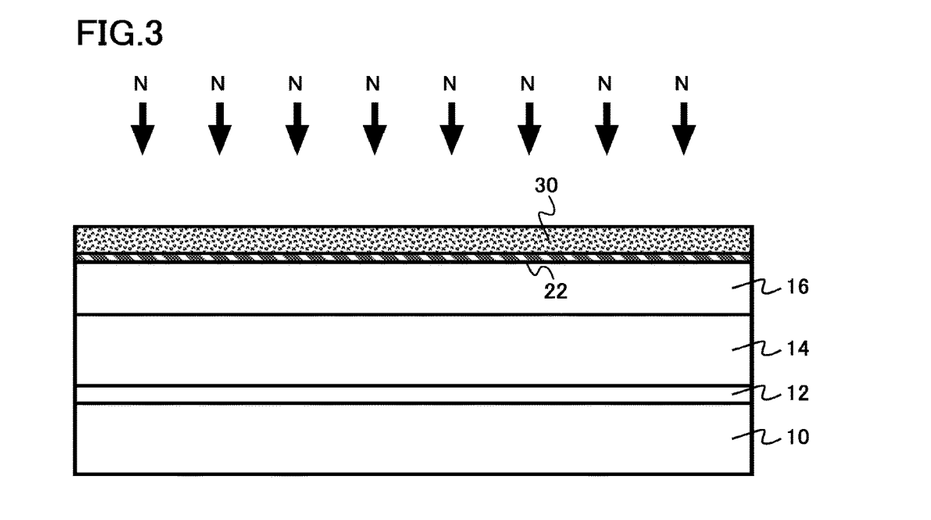
FIG. 3 is a schematic cross-sectional view of the semiconductor device of the first embodiment during manufacturing.

Subsequently, a nitriding treatment is performed in nitrogen plasma at room temperature. Through this nitriding treatment, nitrogen (N) is introduced into the hafnium oxide film 30 (FIG. 3).

For example, as a method for introducing an element other than nitrogen, P, As, Sb, or Bi, a plasma state of each of these elements at room temperature can be used. As another method, a method for piling up N, P, As, Sb, or Bi on an interface through thermal diffusion by ion implantation of N, P, As, Sb, or Bi after a stacked insulating film is formed can be used. A metal species such as Sr can be introduced by vapor deposition of the metal or ion implantation and thermal diffusion.

Figure 4:
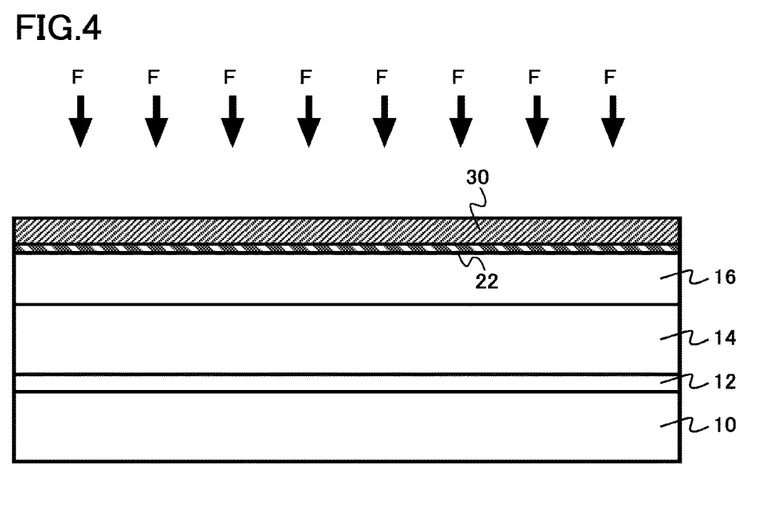
FIG. 4 is a schematic cross-sectional view of the semiconductor device of the first embodiment during manufacturing.

Subsequently, a fluoridation treatment is performed in fluorine plasma at room temperature. Through this fluoridation treatment, fluorine (F) is introduced into the hafnium oxide film 30 (FIG. 4).

As a method for introducing an element other than fluorine, H or D, a plasma state of each of these elements at room temperature can be used. In addition, a method for piling up F, H, or D on an interface through thermal diffusion by ion implantation of F, H, or D after a stacked insulating film is formed can be used. A metal species such as Ta can be introduced by vapor deposition of the metal or the ion implantation and thermal diffusion.

Figure 5:
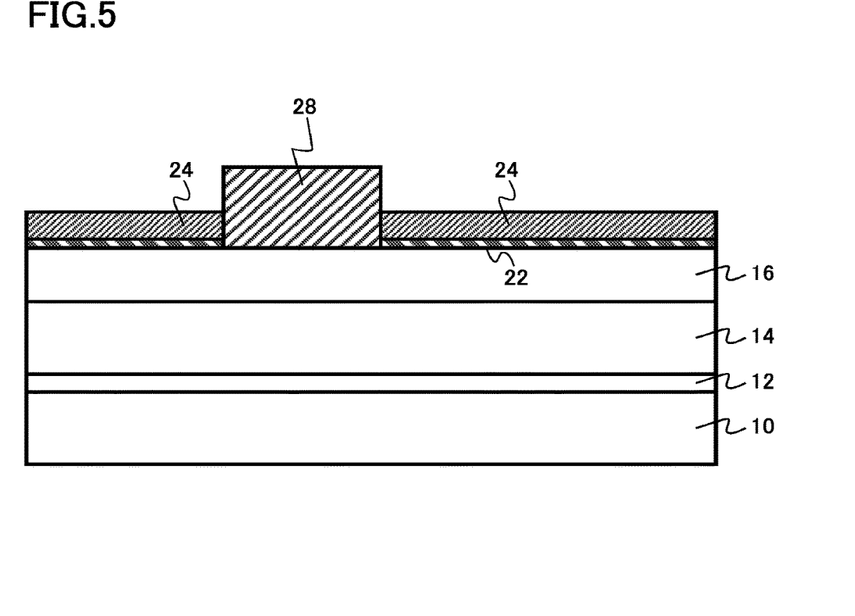
FIG. 5 is a schematic cross-sectional view of the semiconductor device of the first embodiment during manufacturing.

Subsequently, a part of the hafnium oxide film 30 is removed, and the gate electrode 28 is formed on the barrier layer 16 (FIG. 5). The hafnium oxide film 30 into which fluorine has been introduced becomes the protection film 24. Thereafter, the source electrode 18 and the drain electrode 20 are formed on the barrier layer 16 by a known technique.

By the above manufacturing method, the HEMT 100 illustrated in FIG. 1 is formed.

When the protection film 24 is an oxide of at least one first element selected from the group consisting of aluminum (Al), lanthanum (La), yttrium (Y), and scandium (Sc), and contains $5\times10^{19}$ cm$^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), and barium (Ba), an aluminum oxide film may be used in place of the hafnium oxide film 30, for example.

Next, functions and effects of the semiconductor device of the present embodiment will be described.

Figure 6:
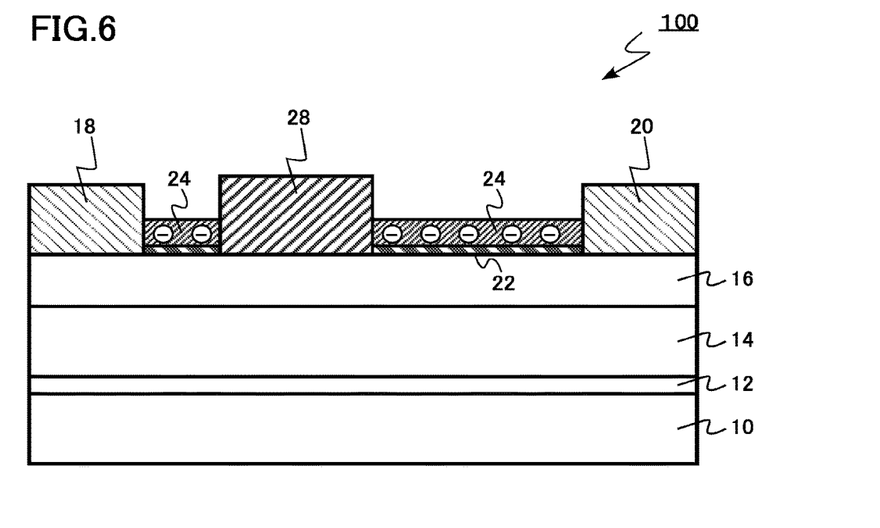
FIG. 6 illustrates functions and effects of the semiconductor device of the first embodiment.

FIG. 6 illustrates functions and effects of the semiconductor device of the present embodiment.

A GaN-based semiconductor HEMT has a problem called "current collapse" with which on-resistance is increased when a high drain voltage is applied. It is considered that "current collapse" occurs primarily due to an electron trapped in the protection film between the gate electrode and the drain electrode. An electron is accelerated by an electric field between 2DEG and the drain electrode, and is trapped in the protection film.

An electron is trapped in the protection film or in an interface between the protection film and the substrate, the potential of the hetero-junction interface thereby changes, and a 2DEG density is lowered. It is considered that on-resistance is thereby increased.

As illustrated in FIG. 6, in the HEMT 100 of the present embodiment, the protection film 24 holds a negative fixed charge. The negative fixed charge is formed in the protection film 24 due to a fact that the protection film 24 is an oxide of at least one first element selected from the group consisting of hafnium (Hf), zirconium (Zr), and titanium (Ti), and contains $5\times10^{19}$ cm$^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), and lanthanoids (La, Ce, Pr, Nd, Pm, Sm, Eu, Gd, Tb, Dy, Ho, Er, Tm, Yb, and Lu).

Alternatively, the negative fixed charge is formed in the protection film 24 due to a fact that the protection film 24 is an oxide of at least one first element selected from the group consisting of aluminum (Al), lanthanum (La), yttrium (Y), and scandium (Sc), and contains $5\times10^{19}$ cm$^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), and barium (Ba).

As a result of a first principle calculation performed by the inventors, it has become clear that, when nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), or a lanthanoid (La, Ce, Pr, Nd, Pm, Sm, Eu, Gd, Tb, Dy, Ho, Er, Tm, Yb, or Lu) is introduced into an oxide of at least one element selected from the group consisting of hafnium (Hf), zirconium (Zr), and titanium (Ti), an oxygen defect is generated to achieve stabilization. In addition, it has become clear that, when fluorine (F), hydrogen (H), deuterium (D), vanadium (V), niobium (Nb), or tantalum (Ta) is introduced into the oxide having an oxygen defect generated therein, an electron is released to fill the oxygen defect, and nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), or a lanthanoid (La, Ce, Pr, Nd, Pm, Sm, Eu, Gd, Tb, Dy, Ho, Er, Tm, Yb, or Lu) turns into a negative fixed charge to achieve stabilization.

In addition, as a result of the first principle calculation performed by the inventors, it has become clear that, when nitrogen (N), phosphorus (P), arsenic (As), antimony (Sb), bismuth (Bi), beryllium (Be), magnesium (Mg), calcium (Ca), strontium (Sr), or barium (Ba) is introduced into an oxide of at least one element selected from the group consisting of aluminum (Al), lanthanum (La), yttrium (Y), and scandium (Sc), an oxygen defect is generated to achieve stabilization. Furthermore, it has become clear that, when fluorine (F), hydrogen (H), deuterium (D), vanadium (V), niobium (Nb), or tantalum (Ta) is introduced into the oxide (second oxide) having the oxygen defect generated therein, an electron is released to fill the oxygen defect, and nitrogen (N), phosphorus (P), arsenic (As), antimony (Sb), bismuth (Bi), beryllium (Be), magnesium (Mg), calcium (Ca), strontium (Sr), or barium (Ba) turns into a negative fixed charge to achieve stabilization.

The protection film 24 between the gate electrode 28 and the drain electrode 20 holds a sufficient amount of negative fixed charge in the film, and electric field intensity between 2DEG and the drain electrode 20 is thereby relaxed. Therefore, the amount and energy of an electron moving from 2DEG to the protection film 24 are suppressed. Therefore, the amount of an electron trapped in the protection film 24 is suppressed. Therefore, current collapse of the HEMT 100 is suppressed.

Particularly, in the present embodiment, the protection film 24 is formed over an entire area between the gate electrode 28 and the drain electrode 20. Therefore, the amount of an electron trapped in the protection film 24 is suppressed over an entire area between the gate electrode 28 and the drain electrode 20.

The concentration of at least one second element selected from the group consisting of fluorine (F), hydrogen (H), deuterium (D), vanadium (V), niobium (Nb), and tantalum (Ta) contained in the protection film 24, and the concentration of at least one third element selected from the group consisting of nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), and lanthanoids (La, Ce, Pr, Nd, Pm, Sm, Eu, Gd, Tb, Dy, Ho, Er, Tm, Yb, and Lu) are each preferably $5\times10^{19}$ cm$^{-3}$ or more and $6.4\times10^{22}$ cm$^{-3}$ or less. When the concentrations are below the above range, it may be impossible to suppress current collapse sufficiently. It is difficult to introduce the above element into the protection film 24 at a concentration higher than the above range.

Furthermore, the concentration of the second element and the concentration of the third element are each preferably $1\times10^{20}$ cm$^{-3}$ or more, and more preferably $5\times10^{20}$ cm$^{-3}$ or more from a viewpoint of improving an effect for suppressing current collapse.

The semiconductor device of the present embodiment can suppress current collapse. Therefore, a semiconductor device having reliability improved can be realized.

Second Embodiment

A semiconductor device of the present embodiment is similar to the first embodiment except including a third nitride semiconductor layer between a second nitride semiconductor layer and a gate electrode. Hereinafter, matters overlapping with the first embodiment will be omitted.

Figure 7:
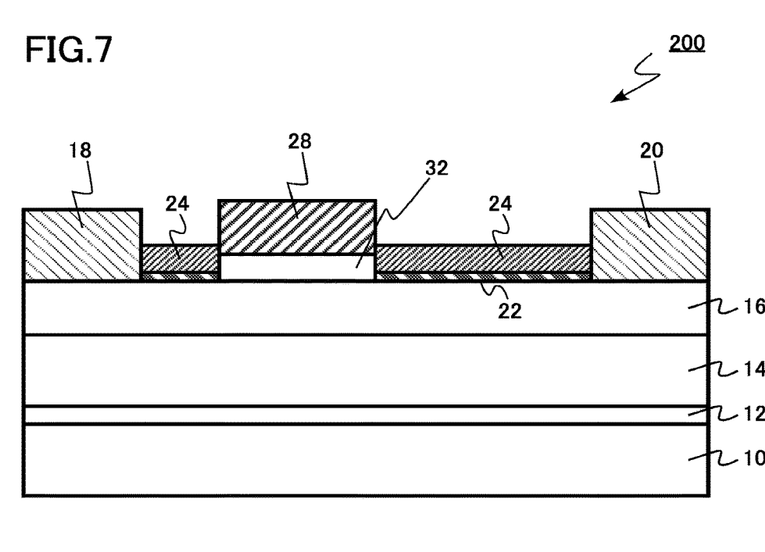
FIG. 7 is a schematic cross-sectional view of a semiconductor device of a second embodiment.

FIG. 7 is a schematic cross-sectional view of the semiconductor device of the present embodiment. The semiconductor device of the present embodiment is a HEMT 200 using a GaN-based semiconductor.

The HEMT 200 includes a p-type layer (third nitride semiconductor layer) 32 between a barrier layer 16 and a gate electrode 28. The p-type layer 32 is formed, for example, of p-type gallium nitride containing magnesium (Mg) as a p-type impurity.

In a GaN-based HEMT, 2DEG is induced also under the gate electrode. Therefore, "normally-on operation" which allows conduction even when voltage is applied to the gate is usually performed. Particularly, in a HEMT involving a large amount of power, "normally-off operation" which does not allow conduction when no voltage is applied to the gate is preferable for safety reasons.

The HEMT 200 includes the p-type layer 32, and thereby reduces 2DEG under the gate electrode 28. Therefore, a threshold voltage of the HEMT 200 can be increased. Therefore, normally-off operation of the HEMT 200 can be realized.

The semiconductor device of the present embodiment suppresses current collapse to improve reliability similarly to the first embodiment. In addition, the semiconductor device can realize normally-off operation.

Third Embodiment

A semiconductor device of the present embodiment is different from the first embodiment in further including a gate insulating layer between the second nitride semiconductor layer and the gate electrode. Hereinafter, matters overlapping with the first embodiment will be omitted.

Figure 8:
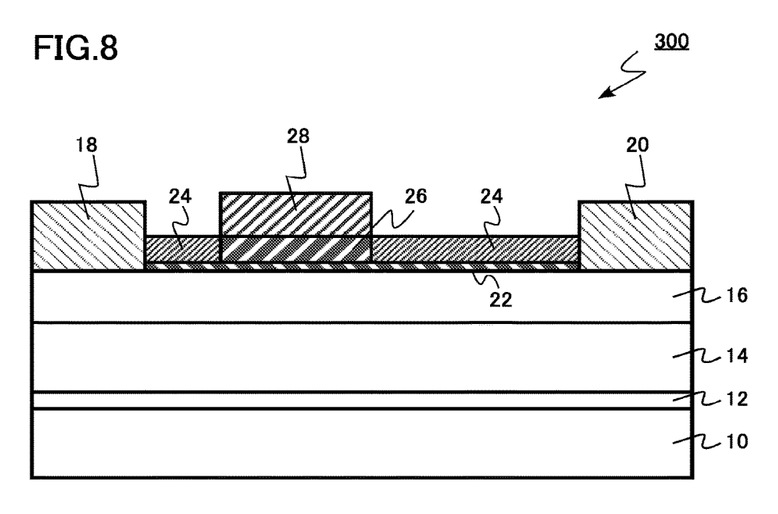
FIG. 8 is a schematic cross-sectional view of a semiconductor device of a third embodiment.

FIG. 8 is a schematic cross-sectional view of the semiconductor device of the present embodiment. The semiconductor device of the present embodiment is a HEMT 300 using a GaN-based semiconductor.

A gate insulating layer 26 is provided between a barrier layer 16 and a gate electrode 28 in the HEMT 300. An interface film 22 is provided between the barrier layer 16 and the gate insulating layer 26.

The gate insulating layer 26 is an oxide of at least one first element selected from the group consisting of hafnium (Hf), zirconium (Zr), and titanium (Ti), and contains $5\times10^{19}$ cm$^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), and lanthanoids (La, Ce, Pr, Nd, Pm, Sm, Eu, Gd, Tb, Dy, Ho, Er, Tm, Yb, and Lu).

Alternatively, the gate insulating layer 26 is an oxide of at least one first element selected from the group consisting of aluminum (Al), lanthanum (La), yttrium (Y), and scandium (Sc) and contains $5\times10^{19}$ cm$^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), and barium (Ba).

For example, an element contained in the gate insulating layer 26 and the concentration of the element can be measured by secondary ion mass spectroscopy (SIMS).

For example, the HEMT 300 can be manufactured by forming a gate electrode 28 on a hafnium oxide film 30 without removing a part of the hafnium oxide film 30 in the method for manufacturing in the first embodiment.

Figure 9:
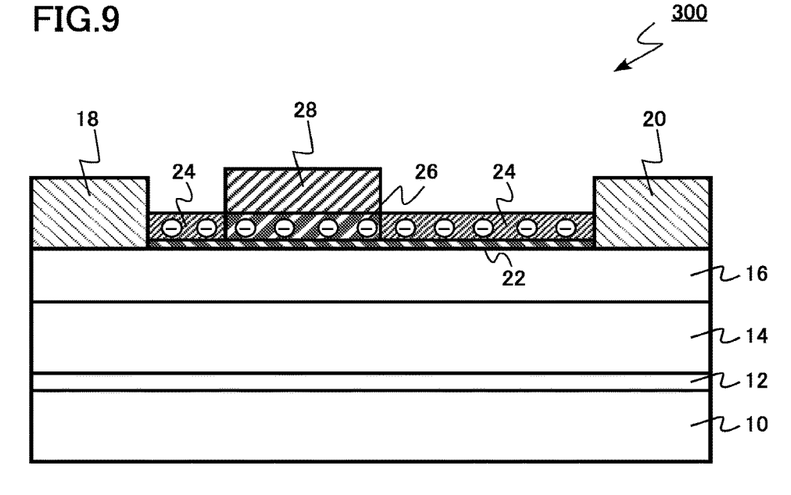
FIG. 9 illustrates functions and effects of the semiconductor device of the third embodiment.

FIG. 9 illustrates functions and effects of the semiconductor device of the present embodiment.

In a GaN-based HEMT, 2DEG is induced also under the gate electrode. Therefore, "normally-on operation" which allows conduction even when voltage is applied to the gate is usually performed. Particularly, in a HEMT involving a large amount of power, "normally-off operation" which does not allow conduction when no voltage is applied to the gate is preferable for safety reasons.

The gate insulating layer 26 holds a negative fixed charge. The gate insulating layer 26 holds a sufficient amount of negative fixed charge in the film, and a threshold voltage of the HEMT 300 can be thereby increased. Therefore, normally-off operation of the HEMT 300 can be realized.

The semiconductor device of the present embodiment suppresses current collapse to improve reliability similarly to the first embodiment. In addition, the semiconductor device can realize normally-off operation.

Fourth Embodiment

A semiconductor device of the present embodiment is different from the first embodiment in further including a gate insulating layer located between a first nitride semiconductor layer and a gate electrode and being in contact with the first nitride semiconductor layer and the gate electrode. Hereinafter, matters overlapping with the first embodiment will be omitted.

Figure 10:
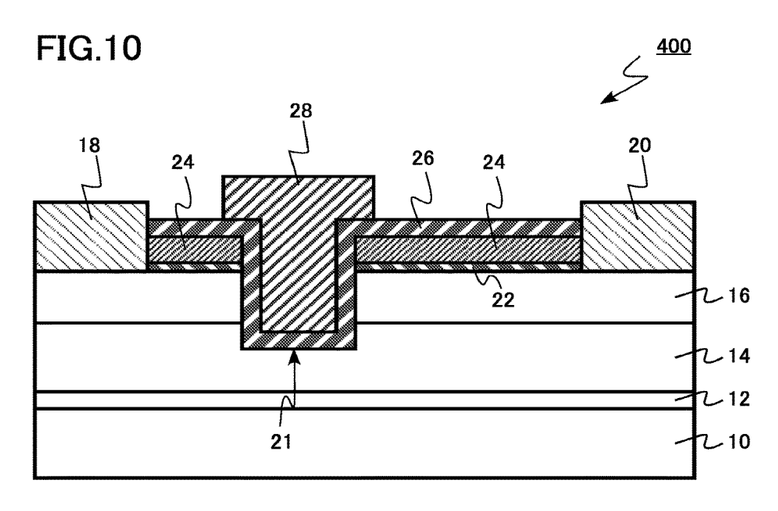
FIG. 10 is a schematic cross-sectional view of a semiconductor device of a fourth embodiment.

FIG. 10 is a schematic cross-sectional view of the semiconductor device of the present embodiment. The semiconductor device of the present embodiment is a HEMT 400 using a GaN-based semiconductor.

The HEMT 400 has a gate insulating layer 26 formed on an inner surface of a recess 21 provided in a barrier layer 16 and a channel layer 14 between a source electrode 18 and a drain electrode 20. A gate electrode 28 is provided in the recess 21.

A bottom of the recess 21 is located in the channel layer 14. The gate insulating layer 26 is in contact with the channel layer 14 and the gate electrode 28. The gate insulating layer 26 is a stacked film of silicon nitride and silicon oxide, for example.

The semiconductor device of the present embodiment suppresses current collapse to improve reliability similarly to the first embodiment. By including a gate recess structure, normally-off operation can be realized.

Fifth Embodiment

A semiconductor device of the present embodiment is different from the fourth embodiment in having a shallow recess. Hereinafter, matters overlapping with the first embodiment will be omitted.

Figure 11:
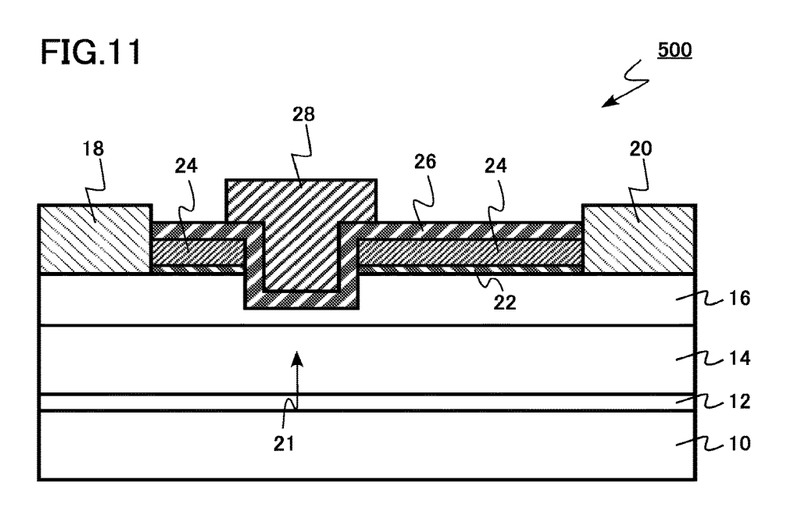
FIG. 11 is a schematic cross-sectional view of a semiconductor device of a fifth embodiment.

FIG. 11 is a schematic cross-sectional view of the semiconductor device of the present embodiment. The semiconductor device of the present embodiment is a HEMT 500 using a GaN-based semiconductor.

The HEMT 500 has a gate insulating layer 26 formed on an inner surface of a recess 21 provided in a barrier layer 16 between a source electrode 18 and a drain electrode 20. A gate electrode 28 is provided in the recess 21.

The bottom portion of the recess 21 is located in the barrier layer 16. The gate insulating layer 26 is in contact with the barrier layer 16 and the gate electrode 28. The gate insulating layer 26 is a stacked film of silicon nitride and silicon oxide, for example.

The semiconductor device of the present embodiment suppresses current collapse to improve reliability similarly to the first embodiment. By including a gate recess structure, normally-off operation can be realized.

Sixth Embodiment

Each of a power supply circuit and a computer of the present embodiment includes HEMT.

Figure 12:
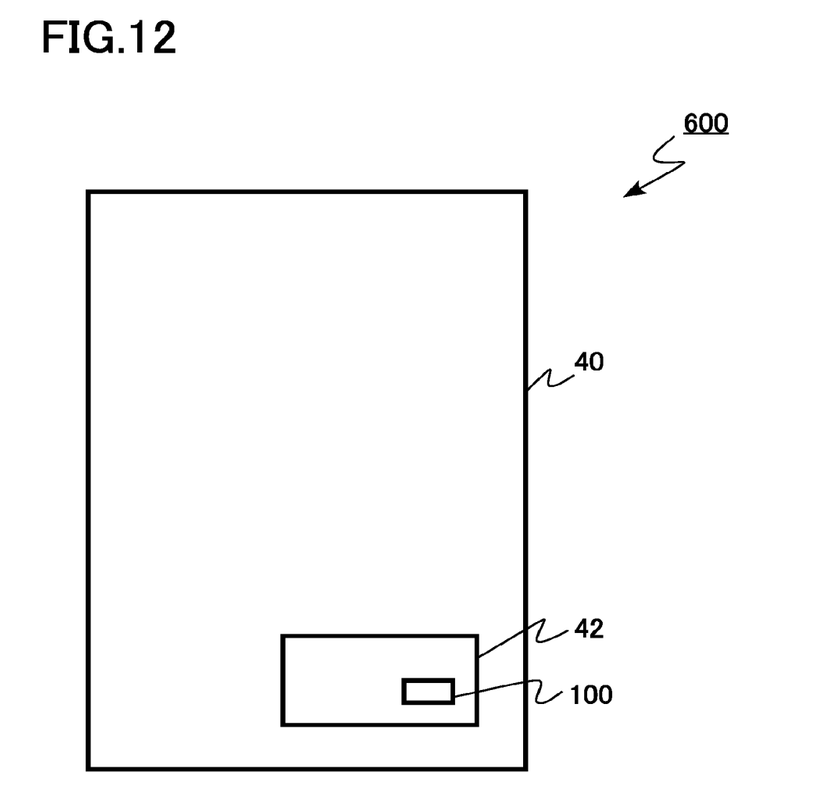
FIG. 12 is a schematic diagram of a computer of a sixth embodiment.

FIG. 12 is a schematic diagram of a computer of the present embodiment. The computer of the present embodiment is a server 600.

The server 600 includes a power supply circuit 42 in a housing 40. The server 600 is a computer for making a server software operate.

The power supply circuit 42 includes the HEMT 100 of the first embodiment. The HEMT 200, the HEMT 300, the HEMT 400, and the HEMT 500 of the second to fifth embodiments may be used in place of the HEMT 100.

The power supply circuit 42 includes the HEMT 100 having current collapse suppressed, and therefore has high reliability. In addition, the server 600 includes the power supply circuit 42, and therefore has high reliability.

The present embodiment can realize a power supply circuit and a computer having high reliability.

In the embodiments, as a material of a nitride semiconductor layer, gallium nitride or aluminum gallium nitride has been exemplified. However, for example, it is also possible to use indium gallium nitride, indium aluminum nitride, or indium aluminum gallium nitride containing indium (In). It is also possible to use aluminum nitride as a material of a nitride semiconductor layer.

In the embodiments, as the barrier layer 16, undoped aluminum gallium nitride has been exemplified. However, it is also possible to use n-type aluminum gallium nitride.

While certain embodiments have been described, these embodiments have been presented by way of example only, and are not intended to limit the scope of the inventions. Indeed, a semiconductor device, a power supply circuit, and a computer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first nitride semiconductor layer;
a second nitride semiconductor layer provided on the first nitride semiconductor layer and having a larger bandgap than the first nitride semiconductor layer;
a first electrode provided on the second nitride semiconductor layer;
a second electrode provided on the second nitride semiconductor layer;
a gate electrode provided between the first electrode and the second electrode; and
a first insulating layer provided at least between the gate electrode and the second electrode, the first insulating layer not being included under the gate electrode, the first insulating layer provided on the second nitride semiconductor layer, the first insulating layer being an oxide of at least one first element selected from the group consisting of hafnium (Hf), zirconium (Zr), and titanium (Ti), and containing $5\times10^{19}$ cm$^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), and lanthanoids (La, Ce, Pr, Nd, Pm, Sm, Eu, Gd, Tb, Dy, Ho, Er, Tm, Yb, and Lu).

2. The semiconductor device according to claim 1, wherein the first insulating layer is in contact with the second electrode.

3. The semiconductor device according to claim 1, further comprising a second insulating layer provided between the second nitride semiconductor layer and the first insulating layer.

4. The semiconductor device according to claim 1, further comprising a gate insulating layer provided between the second nitride semiconductor layer and the gate electrode.

5. The semiconductor device according to claim 4, wherein the gate insulating layer is an oxide of at least one first element selected from the group consisting of hafnium (Hf), zirconium (Zr), and titanium (Ti), and contains $5\times10^{19}$ cm$^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), barium (Ba), scandium (Sc), yttrium (Y), and lanthanoids (La, Ce, Pr, Nd, Pm, Sm, Eu, Gd, Tb, Dy, Ho, Er, Tm, Yb, and Lu).

6. The semiconductor device according to claim 1, further comprising a gate insulating layer provided between the first nitride semiconductor layer and the gate electrode, the gate insulating layer being in contact with the first nitride semiconductor layer and the gate electrode.

7. The semiconductor device according to claim 1, wherein the first nitride semiconductor layer includes gallium nitride, and the second nitride semiconductor layer includes aluminum gallium nitride.

8. A power supply circuit comprising the semiconductor device according to claim 1.

9. A computer comprising the semiconductor device according to claim 1.

10. A semiconductor device comprising:
a first nitride semiconductor layer;
a second nitride semiconductor layer provided on the first nitride semiconductor layer and having a larger bandgap than the first nitride semiconductor layer;
a first electrode provided on the second nitride semiconductor layer;
a second electrode provided on the second nitride semiconductor layer;
a gate electrode provided between the first electrode and the second electrode; and
a first insulating layer provided at least between the gate electrode and the second electrode, the first insulating layer not being included under the gate electrode, the first insulating layer provided on the second nitride semiconductor layer, the first insulating layer being an oxide of at least one first element selected from the group consisting of aluminum (Al), lanthanum (La), yttrium (Y), and scandium (Sc), and containing $5\times10^{19}$ cm$^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), and barium (Ba).

11. The semiconductor device according to claim 10, wherein the first insulating layer is in contact with the second electrode.

12. The semiconductor device according to claim 10, further comprising a second insulating layer provided between the second nitride semiconductor layer and the first insulating layer.

13. The semiconductor device according to claim 10, further comprising a gate insulating layer provided between the second nitride semiconductor layer and the gate electrode.

14. The semiconductor device according to claim 13, wherein the gate insulating layer is an oxide of at least one first element selected from the group consisting of aluminum (Al), lanthanum (La), yttrium (Y), and scandium (Sc), and contains $5\times10^{19}$ cm$^{-3}$ or more of at least one second element selected from the group consisting of fluorine (F), hydrogen (H), deuterium (D), vanadium (V), niobium (Nb), and tantalum (Ta), and $5\times10^{19}$ cm$^{-3}$ or more of at least one third element selected from the group consisting of nitrogen (N), phosphorus (P), arsenic (As), antimony (Sb), bismuth (Bi), beryllium (Be), magnesium (Mg), calcium (Ca), strontium (Sr), and barium (Ba).

15. The semiconductor device according to claim 10, further comprising a gate insulating layer provided between the first nitride semiconductor layer and the gate electrode, the gate insulating layer being in contact with the first nitride semiconductor layer and the gate electrode.

16. The semiconductor device according to claim 10, wherein the first nitride semiconductor layer includes gallium nitride, and the second nitride semiconductor layer includes aluminum gallium nitride.

17. A power supply circuit comprising the semiconductor device according to claim 10.

18. A computer comprising the semiconductor device according to claim 10.

* * * * *